US012787780B2

(12) United States Patent
Liu

(10) Patent No.: US 12,787,780 B2
(45) Date of Patent: Nov. 3, 2026

(54) HEAT DISSIPATION ASSEMBLY

(71) Applicants: INVENTEC (PUDONG) TECHNOLOGY CORPORATION, Shanghai (CN); INVENTEC CORPORATION, Taipei City (TW)

(72) Inventor: Ming Tsung Liu, Taipei City (TW)

(73) Assignees: INVENTEC (PUDONG) TECHNOLOGY CORPORATION, Shanghai (CN); INVENTEC CORPORATION, Taipei City (TW)

( * ) Notice: Subject to any disclaimer, the term of this patent is extended or adjusted under 35 U.S.C. 154(b) by 174 days.

(21) Appl. No.: 18/977,251

(22) Filed: Dec. 11, 2024

(65) Prior Publication Data

US 2025/0379119 A1 Dec. 11, 2025

(30) Foreign Application Priority Data

Jun. 11, 2024 (CN) ......................... 202410750104.8

(51) Int. Cl.
*H10W 40/73* (2026.01)

(52) U.S. Cl.
CPC .................................. *H10W 40/73* (2026.01)

(58) Field of Classification Search
CPC .............. H10W 40/47; H05K 7/20927; H05K 7/20254
See application file for complete search history.

(56) References Cited

U.S. PATENT DOCUMENTS

2023/0156956 A1* 5/2023 Hsieh ........................ G06F 1/20
62/177

FOREIGN PATENT DOCUMENTS

CN 103791098 A * 5/2014 ......... F16K 37/0016

* cited by examiner

*Primary Examiner* — Jenna M Maroney
*Assistant Examiner* — Bigyan Bhattachan
(74) *Attorney, Agent, or Firm* — Maschoff Brennan

(57) ABSTRACT

A heat dissipation assembly comprises a casing, a pushed member, a plug and a phase change fluid. The casing has a first fluid space, a second fluid space and a communication channel. The first fluid space and second fluid space are in fluid communication with each other by the communication channel. A first end of the pushed member is fixed to the casing. The plug is movably disposed in the casing and has a closed position and an open position. The plug has an inner space. The phase change fluid is disposed in the inner space. A second end of the pushed member extends into the inner space and seals the phase change fluid in the inner space. When the phase change fluid is in a liquid state, the plug is in the closed position and closes the communication channel.

9 Claims, 6 Drawing Sheets

30

HEAT DISSIPATION ASSEMBLY

CROSS-REFERENCE TO RELATED APPLICATIONS

This non-provisional application claims priority under 35 U.S.C. § 119(a) on Patent Application No(s). 202410750104.8 filed in China, on Jun. 11, 2024, the entire contents of which are hereby incorporated by reference.

BACKGROUND OF THE INVENTION

Technical Field of the Invention

The invention relates to a heat dissipation assembly, more particularly to a heat dissipation assembly operates without additional power consumption.

Description of the Related Art

With the development of electronic devices such as servers, users continuously seek faster computational speeds. The central processing unit (CPU) in electronic device generates significant amount of heat during high-speed operations. However, to keep the CPU to be functional, the CPU must operate within a specific temperature range to avoid overheating. If the CPU's temperature becomes too high, the CPU may become malfunctional.

Therefore, a heat dissipation assembly is typically disposed on the CPU to keep its temperature within a specified range during operation. Current heat dissipation assembly often uses coolant for heat dissipation, and uses power-consuming detection elements to monitor the CPU's temperature. When the CPU's temperature is lower than a threshold, a plug in the heat dissipation assembly is closed, stopping the coolant from flowing. When the CPU's temperature exceeds the threshold, the plug in the heat dissipation assembly is opened, allowing the cooling fluid to flow. In such mechanism, the plug is closed or opened by consuming electrical power.

In recent years, with the rise of environmental awareness, there has been a pursuit not only for faster computational speeds but also for lower power consumption.

SUMMARY OF THE INVENTION

In view of the above problems, one objective of the invention is to provide a heat dissipation assembly that can operate without additional power consumption.

One embodiment of the invention provides a heat dissipation assembly comprising: a casing, a pushed member, a plug, and a phase change fluid. The casing has a first fluid space, a second fluid space, and a communication channel. The first fluid space and the second fluid space are in fluid communication with each other by the communication channel. A first end of the pushed member is fixed to the casing. The plug is movably disposed in the casing and has a closed position and an open position. The plug has an inner space, and a second end of the pushed member extends into the inner space. The phase change fluid is disposed in the inner space, with the second end of the pushed member sealing the phase change fluid inside the inner space. When the phase change fluid is in a liquid state, the plug is located at the closed position and closes the communication channel. When the phase change fluid vaporizes into a gaseous state and expands, the plug is pushed away from the first end, causing the plug to move from the closed position to the open position.

According to the heat dissipation assembly of one embodiment of the invention, the phase change fluid vaporizes into a gaseous state, generating pressure by expanding and pushing the plug from the closed position to the open position. Therefore, when the ambient temperature of the heat dissipation assembly is lower than the phase change temperature (e.g., boiling point) of the phase change fluid, the plug keeps in the closed position, allowing the coolant to stay in the first fluid space and absorb heat from the environment. When the ambient temperature of the heat dissipation assembly is higher than the phase change temperature of the phase change fluid, the plug may be moved the open position, allowing the coolant to flow from the first fluid space to the second fluid space by the communication channel, thereby carrying the absorbed heat away from the heat dissipation assembly. The movement of the plug between the open position and the close position occurs without any power consumption, thus achieving energy saving effect.

The above description of the content and the following description of the embodiments of the invention, are intended to illustrate and explain the principles of the invention and to further clarify the scope of the claims of the invention.

BRIEF DESCRIPTION OF THE DRAWINGS

The invention will become more fully understood from the detailed description given hereinbelow and the accompanying drawings which are given by way of illustration only and thus are not limitative of the invention and wherein.

DETAILED DESCRIPTION

Figure 1:
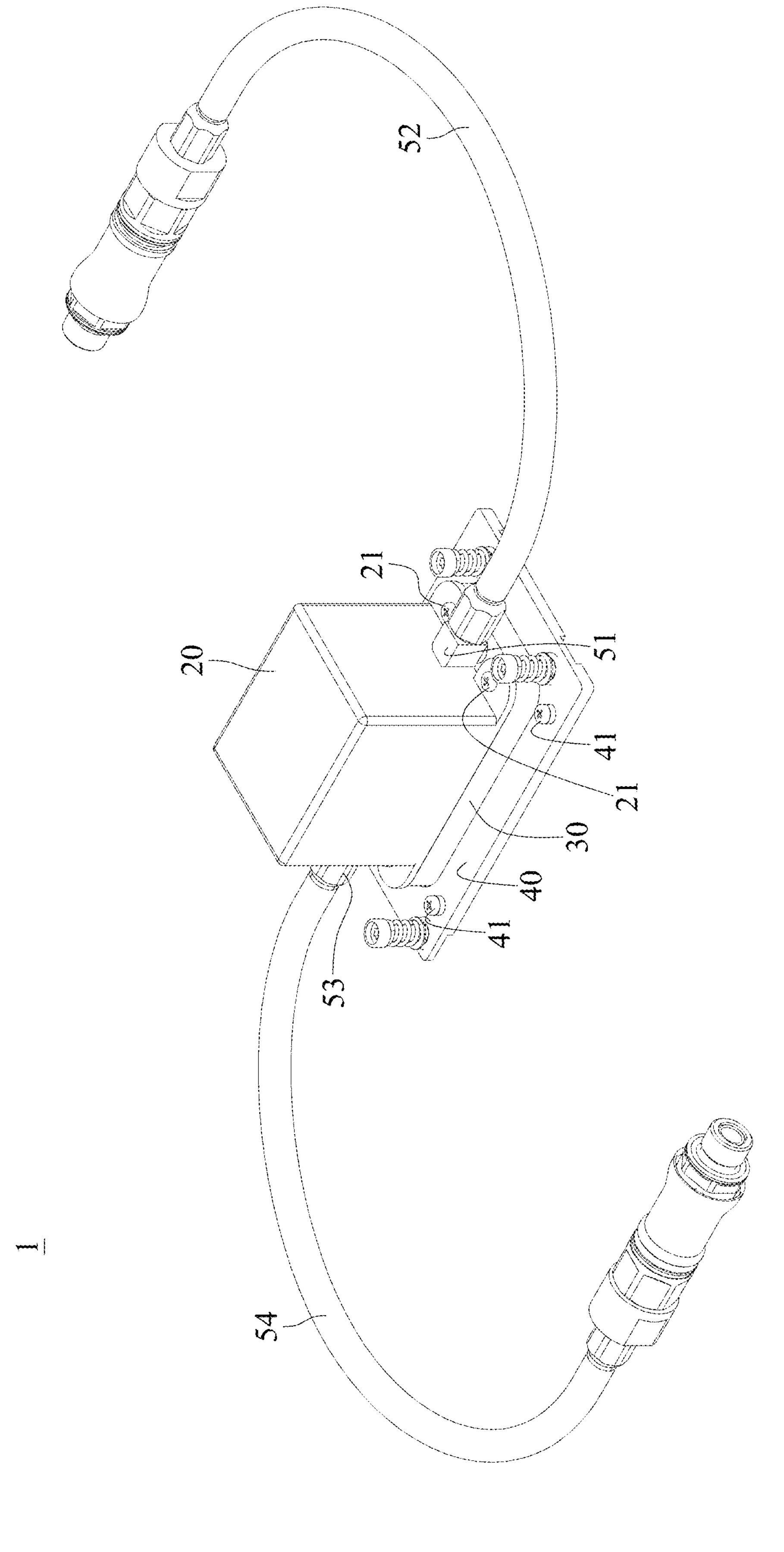
FIG. 1 is a schematic perspective view of a heat dissipation assembly 1 according to one embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The following embodiments provide a detailed description of the features and advantages of the embodiments of the invention, sufficient for those skilled in the art to understand the technical content of the embodiments and implement them accordingly. Based on the disclosures in this specification, including the claims and drawings, those skilled in the art can readily understand the objectives and advantages associated with the invention. The embodiments described below are intended to further illustrate the content of the invention, but are not intended to limit the scope of the invention.

In the schematic drawings presented in the specification, the sizes, proportions, and angles may be exaggerated for illustrative purposes and are not intended to limit the invention. Various modifications can be made without departing from the spirit of the invention. The directions such as top, bottom, front, and back mentioned in the descriptions of the embodiments and drawings are for explanation purposes only and do not limit the invention.

Figure 2:
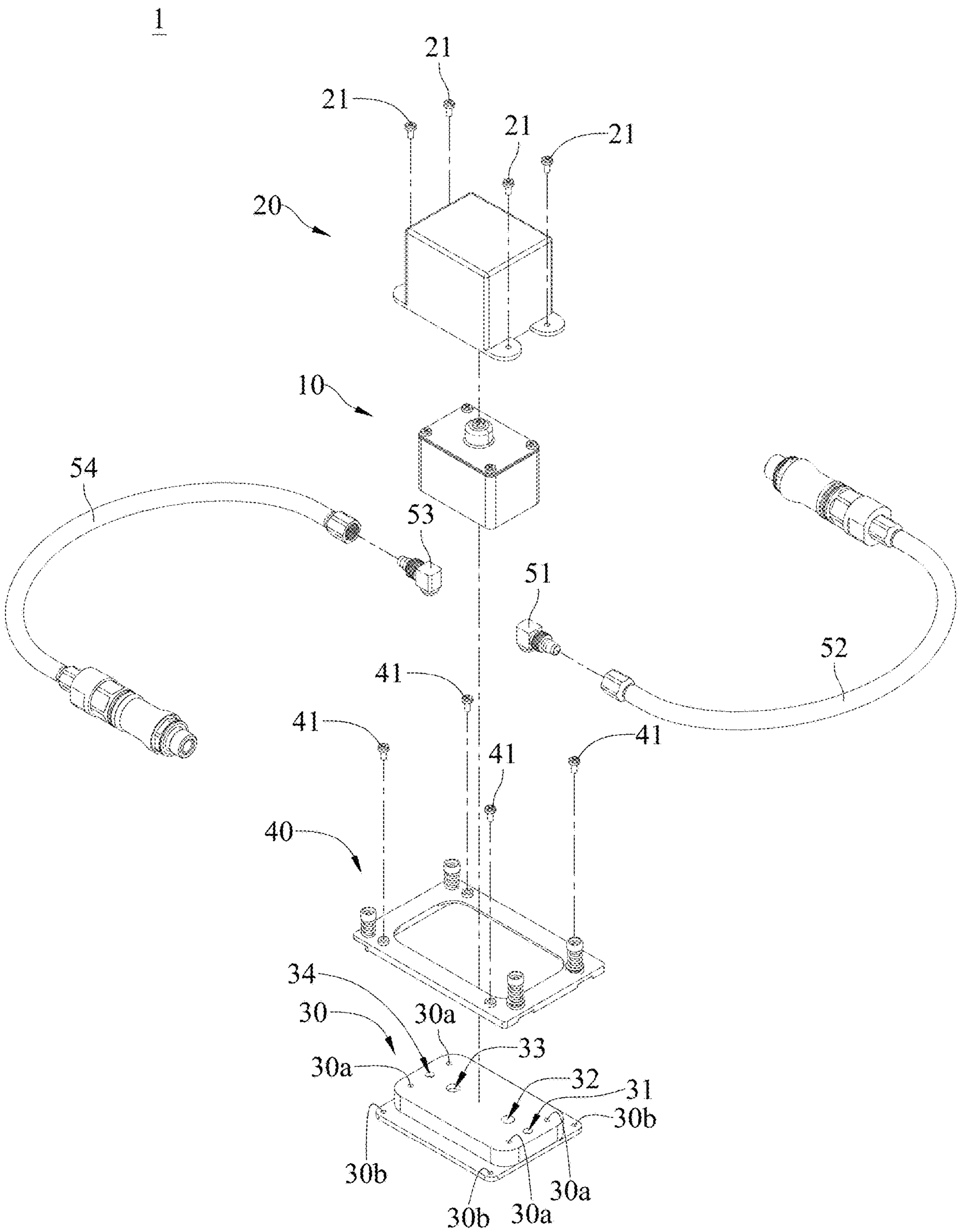
FIG. 2 is a schematic exploded perspective view of the heat dissipation assembly 1 in FIG. 1.
Figure 3:
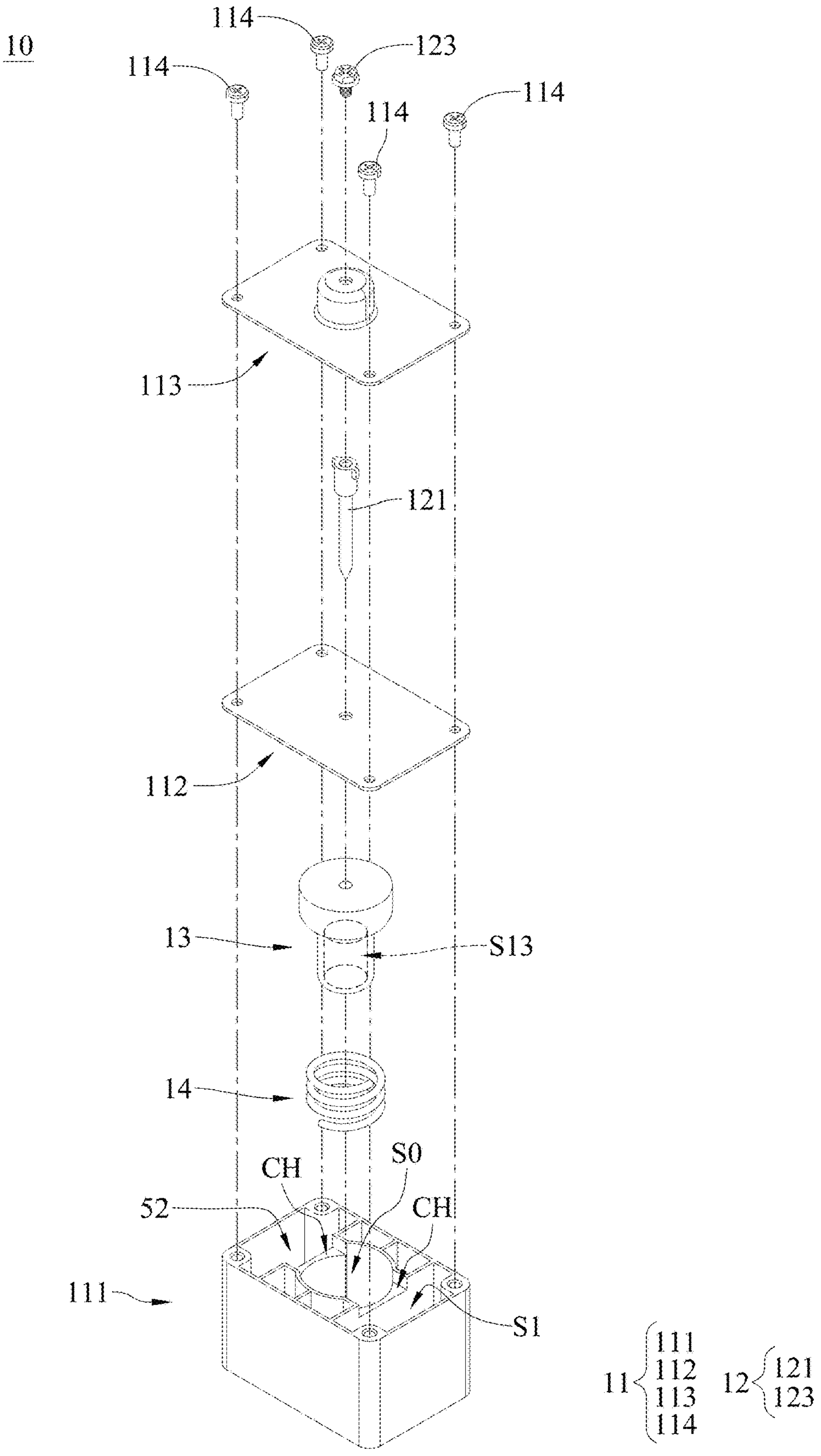
FIG. 3 is a schematic exploded perspective view of a phase change assembly 10 of the heat dissipation assembly 1 in FIG. 2.
Figure 4:
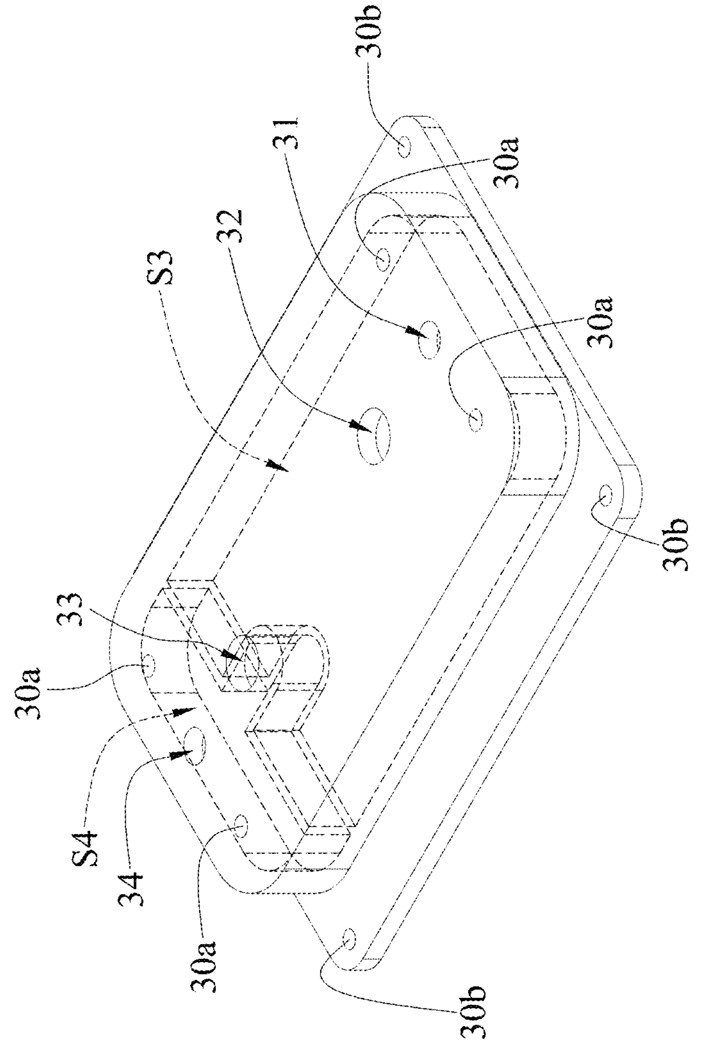
FIG. 4 is a schematic perspective view of a heat dissipation substrate 30 of the heat dissipation assembly 1 in FIG. 2.
Figure 5:
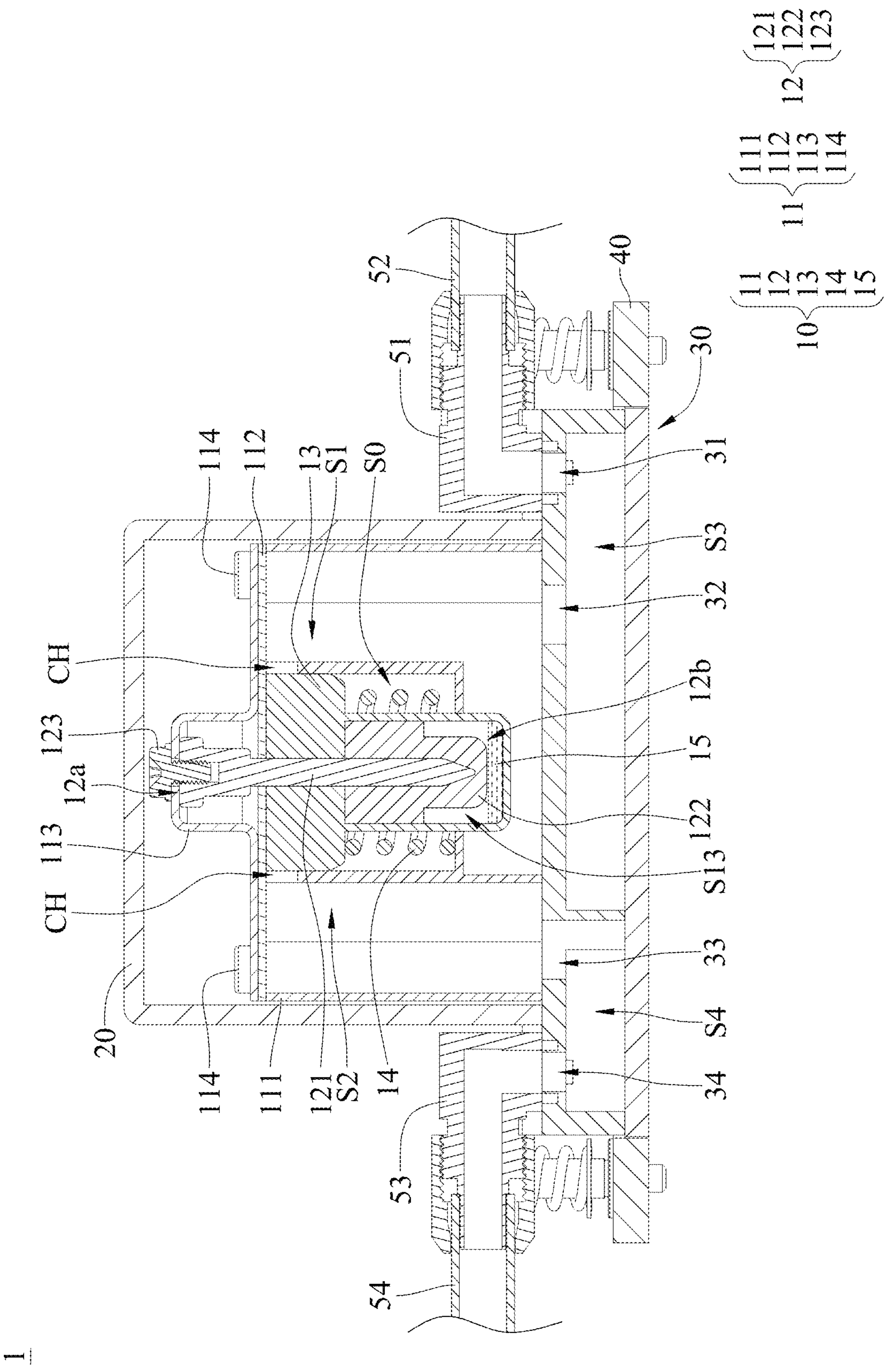
FIG. 5 is a schematic front cross-sectional view of the heat dissipation assembly 1 in FIG. 1, with a plug 13 located in a closed position.

Please refer to FIG. 1 to FIG. 5. FIG. 1 is a schematic perspective view of a heat dissipation assembly 1 according to one embodiment of the invention. FIG. 2 is a schematic exploded perspective view of the heat dissipation assembly 1 in FIG. 1. FIG. 3 is a schematic exploded perspective view of the phase change assembly 10 of the heat dissipation assembly 1 in FIG. 2. FIG. 4 is a schematic perspective view of the heat dissipation substrate 30 of the heat dissipation assembly 1 in FIG. 2. FIG. 5 is a schematic front cross-sectional view of the heat dissipation assembly 1 in FIG. 1, with the plug 13 located in the closed position.

As shown in FIGS. 1, 2, and 4, the heat dissipation assembly 1 includes a phase change assembly 10, a housing 20, a plurality of screws 21, a heat dissipation substrate 30, a fixing bracket 40, a plurality of screws 41, an injection fitting 51, an injection tube 52, a discharge fitting 53, and a discharge tube 54. The housing 20 covers the phase change assembly 10 and is fixed to the heat dissipation substrate 30 by the screws 21 that are screwed into threaded holes **30*a* on the heat dissipation substrate 30. The phase change assembly 10 is located in the area enclosed by the housing 20 and the heat dissipation substrate 30. The fixing bracket 40 is fixed to the heat dissipation substrate 30 by the screws 41 screwed into threaded holes 30*b***.

As shown in FIGS. 3 and 5, the phase change assembly 10 includes a casing 11, a pushed member 12, a plug 13, an elastic member 14, and a phase change fluid 15.

The casing 11 includes a main body 111, a rubber gasket 112, a cover 113, and a plurality of screws 114.

The main body 111 defines a first fluid space S1, a second fluid space S2, a communication channel CH, and a plug accommodation space S0. The first fluid space S1 and the second fluid space S2 are in fluid communication with each other by the communication channel CH. The plug accommodation space S0 is located on one side of the communication channel CH and is in fluid communication with the communication channel CH. The rubber gasket 112 covers the main body 111. The cover 113 is fixed to the main body 111 by the screws 114. The rubber gasket 112 is clamped between the cover 113 and the main body 111. The first fluid space S1, the second fluid space S2, and the communication channel CH are partially defined by the rubber gasket 112. Thus, the casing 11 includes the first fluid space S1, the second fluid space S2, and the communication channel CH. In addition, the first fluid space S1 is larger than the second fluid space S2.

The pushed member 12 includes a bar portion 121 and a sealing portion 122 that are in contact with each other, and further includes a screw 123. The pushed member 12 has a first end **12*a* and a second end 12*b*. The bar portion 121 is located at the first end 12*a*, while the sealing portion 122 is located at the second end 12*b*. The bar portion 121 (i.e., the first end 12*a* of the pushed member 12) is fixed to the cover 113 of the casing 11 by the screw 123. The bar portion 121 of the pushed member 12 penetrates through the rubber gasket 112. The pushed member 12 penetrates through the communication channel CH, and the second end 12*b* extends into the plug accommodation space S0. The end of the bar portion 121 that contacts the sealing portion 122 has a tapered shape. In this embodiment, the shape of the end of the bar portion 121 that contacts the sealing portion 122** is conical, but it is not limited thereto. The shape of the end of the bar portion that contacts the sealing portion may also be hemispherical, ellipsoidal, or egg-shaped in other embodiments.

The plug 13 is movably disposed in the casing 11 and has a closed position and an open position. When the plug 13 is located at the closed position, it is located close to the first end **12*a* of the pushed member 12, and when the plug 13 is located at the open position, it is located away from the first end 12*a* of the pushed member 12. The plug accommodation space S0 accommodates most portion of the plug 13. Another portion of the plug 13 is located in the first fluid space S1**.

The plug 13 has an inner space S13. The phase change fluid 15 is disposed in the inner space S13. The second end **12*b* of the pushed member 12 extends into the inner space S13. The sealing portion 122 of the pushed member 12 is disposed in the inner space S13. The sealing portion 122 seals the phase change fluid 15 in the inner space S13. The sealing portion 122 separates the bar portion 121 from the phase change fluid 15. The phase change fluid 15** has a phase change temperature (e.g., boiling point) below 100° C., and the phase change temperature may range from 45° C. to 60° C.

The elastic member 14 is disposed in the plug accommodation space S0, and is located between the plug 13 and the casing 11. The elastic member 14 normally pushes the plug 13 toward the first end **12*a* of the pushed member 12. In other words, the elastic member 14 keeps the plug 13 in the closed position. In this embodiment, the elastic member 14** is a coil spring, but it is not limited thereto.

During the assembly of the phase change assembly 10, the main body 111 of the casing 11 may be prepared firstly. The phase change fluid 15 also may be filled into the inner space S13 of the plug 13 firstly. Then the sealing portion 122 of the pushed member 12 is placed into the inner space S13, thereby sealing the phase change fluid 15 in the inner space S13. In addition, the bar portion 121 of the pushed member 12 can be fixed to the cover 113 of the casing 11 by the screw 123.

Then, the elastic member 14 and the plug 13 are placed into the plug accommodation space S0. The main body 111 and the plug 13 are coved by the rubber gasket 112, ensuring that the first fluid space S1, the second fluid space S2, and the communication channel CH are partially defined by the rubber gasket 112. The cover 113 is placed on the rubber gasket 112, allowing the bar portion 121 of the pushed member 12 to penetrate through the rubber gasket 112 and contact the sealing portion 122. The cover 113 is fixed to the main body 111 with the screws 114. To this end, the assembly of the phase change assembly 10 is completed.

The heat dissipation substrate 30 has a third fluid space S3 and a fourth fluid space S4. The third fluid space S3 has a first inlet 31 and a first outlet 32, while the fourth fluid space S4 has a second inlet 33 and a second outlet 34. The third fluid space S3 is larger than the fourth fluid space S4. The casing 11 of the phase change assembly 10 is disposed on the heat dissipation substrate 30. The casing 11 of the phase change assembly 10 is in fluid communication with the first outlet 32, and the second fluid space S2 is in fluid communication with the second inlet 33.

During the assembly of the heat dissipation assembly 1, the assembled phase change assembly 10 may be placed on the heat dissipation substrate 30. The housing 20 is used to cover the phase change assembly 10 and is fixed to the heat dissipation substrate 30 by the screws 21 screwed into the threaded holes 30*a*. The fixing bracket 40 is fixed to the heat dissipation substrate 30 by the screws 41 screwed into the threaded holes 30*b*. The injection fitting 51 is connected to the first inlet 31 of the heat dissipation substrate 30, and the injection tube 52 is connected to the injection fitting 51. The discharge fitting 53 is connected to the second outlet 34 of the heat dissipation substrate 30, and the discharge tube 54 is connected to the discharge fitting 53. To this end, the assembly of the heat dissipation assembly 1 is completed.

When using the heat dissipation assembly 1, the heat dissipation assembly is fixed to a heat source (not shown) by the fixing bracket 40, allowing the heat dissipation substrate 30 to be in thermal contact with the heat source. The heat source may be an electronic component generating a significant amount of heat, such as a central processing unit (CPU) in an electronic device. At this time, the coolant may be injected into the heat dissipation assembly 1 through the injection tube 52 and discharged from the discharge tube 54.

In this embodiment, although the heat dissipation substrate 30 is provided, but the invention is not limited thereto. In other embodiments, the heat dissipation substrate 30 may be omitted, and the injection fitting may be directly connected to the main body of the casing and in fluid communication with the first fluid space, the discharge fitting may be directly connected to the main body and in fluid communication with the second fluid space, and the main body of the casing may be directly in thermal contact with the heat source.

Figure 6:
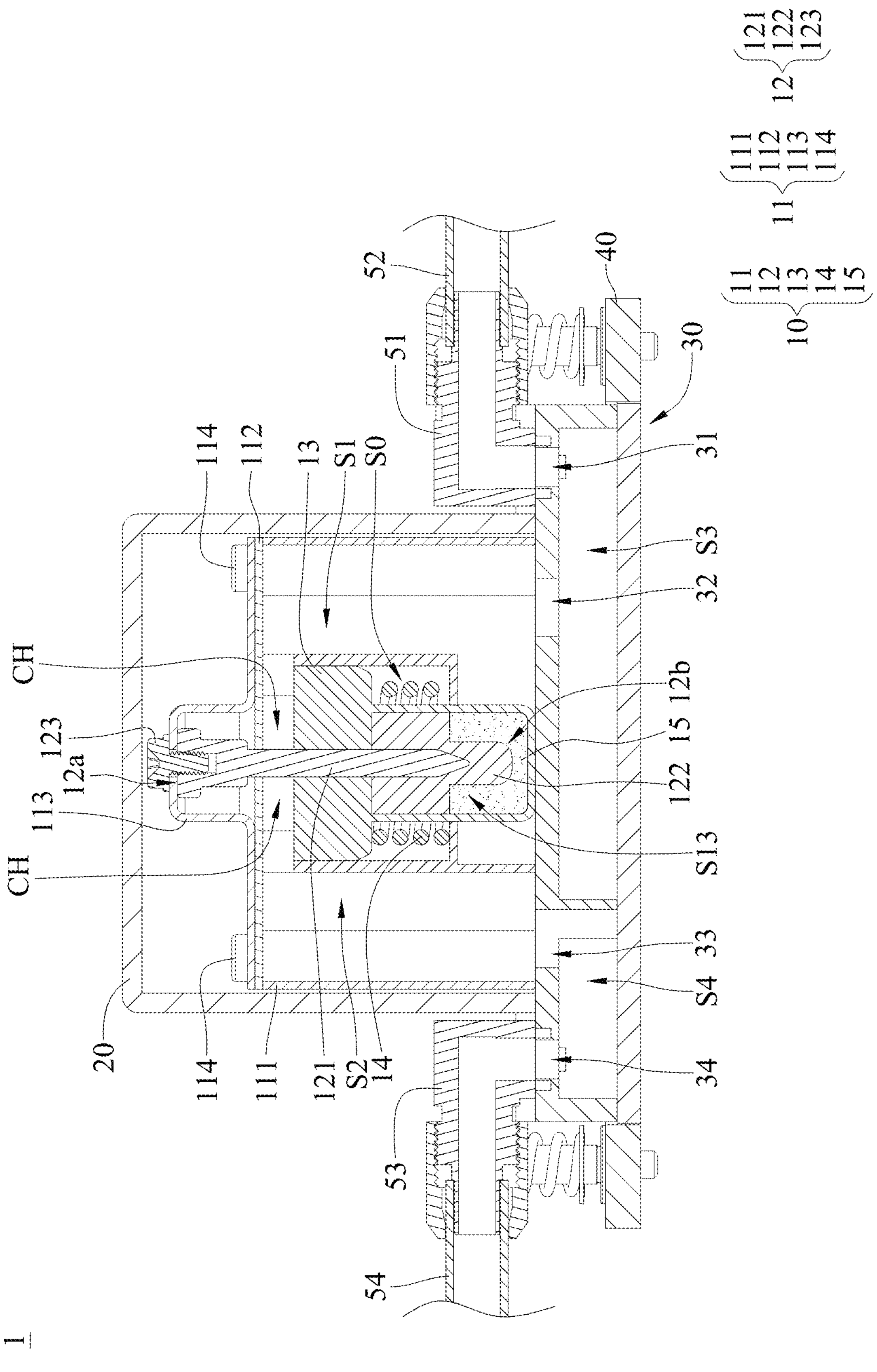
FIG. 6 is a schematic front cross-sectional view of the heat dissipation assembly 1 in FIG. 1, with the plug 13 located in an open position.

Please refer to FIGS. 5 and 6 for an illustration of the operation of the heat dissipation assembly 1. FIG. 6 is a front cross-sectional view of the heat dissipation assembly 1 in FIG. 1, with the plug located in the open position.

As shown in FIG. 5, the elastic member 14 normally keeps the plug 13 in the closed position. When the heat source (e.g., a central processing unit) has a low temperature, the coolant retains in the first fluid space S1 and the third fluid space S3 to absorb heat generated by the heat source. At this time, the phase change fluid 15 is in a liquid state. Since the plug 13 is located in the closed position, the plug 13 closes the communication channel CH. In addition, during the initial use of the heat dissipation assembly 1, there may be no coolant in the second fluid space S2 and the fourth fluid space S4.

Since the first fluid space S1 is larger than the second fluid space S2, and the third fluid space S3 is larger than the fourth fluid space S4, when the plug 13 is located in the closed position, a larger amount of coolant can retain in the larger first fluid space S1 and the larger third fluid space S3 to absorb the heat generated by the heat source.

Since a portion of the plug 13 is located in the first fluid space S1, the phase change fluid 15 in the plug 13 may cool the cooling fluid retained in the first fluid space S1.

As shown in FIG. 6, when the heat source has a high temperature, the phase change fluid 15 vaporizes into a gaseous state and expands. The gaseous phase change fluid 15 generates pressure, causing the sealing portion 122 of the pushed member 12 to deform by the pressure, which in turn transfers the pressure to the bar portion 121 of the pushed member 12. The gaseous phase change fluid 15 pushes the bar portion 121 of the pushed member 12 upward and pushes the bottom surface of the inner space S13 of the plug 13 downward. Consequently, the gaseous phase change fluid 15 pushes the plug 13 to overcome the force applied by the elastic member 14, causing the plug 13 to move away from the first end 12*a* of the pushed member 12 along the bar portion 121, thereby moving the plug 13 from the closed position to the open position shown in FIG. 6.

Because the end of the bar portion 121 in contact with the sealing portion 122 has a tapered shape, the pressure generated by the gaseous phase change fluid 15 is at least partially transferred toward the axis of the bar portion 121. Thus, the pressure generated by the phase change fluid 15 is ensured to move the plug 13 away from the first end 12*a* along the bar portion 121.

When the plug 13 is located in the open position, the coolant can flow from the first inlet 31 to the second outlet 34 through the third fluid space S3, the first outlet 32, the first fluid space S1, the communication channel CH, the second fluid space S2, the second inlet 33, and the fourth fluid space S4. Thus, the coolant can effectively cool the heat source and the heat dissipation assembly 1. When the phase change fluid 15 in the inner space S13 of the plug 13 condenses from the gaseous state back to the liquid state, it no longer provides the pressure overcoming the force generated by the elastic member 14. As a result, the elastic member 14 pushes the plug 13 back to the closed position shown in FIG. 5 again. In addition, during continuous operation of the heat dissipation assembly 1, there may be a part of the coolant retained in the second fluid space S2 and fourth fluid space S4 when the plug 13 is located in the closed position.

In this way, as shown in FIGS. 5 and 6, the cycle can repeat, allowing the coolant to flow without consuming electrical power. When the heat source and the heat dissipation assembly 1 have a low temperature, the plug 13 is located in the closed position, and the cooling fluid stops flowing. When the heat source and the heat dissipation assembly 1 have a high temperature, the phase change fluid 15 in the inner space S13 of the plug 13 changes from a liquid state to a gaseous state, generating pressure that pushes the plug 13 from the closed position to the open position and allowing the coolant to flow.

In this embodiment, the server of the invention may be used for artificial intelligence (AI) computing, edge computing, as well as functioning as a 5G server, cloud server, or a server for vehicle-to-everything.

In summary, in the heat dissipation assembly of one embodiment of the invention, the phase change fluid vaporizes into a gaseous state, generating pressure by expanding and pushing the plug from the closed position to the open position. Therefore, when the ambient temperature of the heat dissipation assembly is lower than the phase change temperature of the phase change fluid, the plug retains in the closed position, allowing the coolant to stay in the first fluid space and absorb heat from the environment. When the ambient temperature of the heat dissipation assembly is higher than the phase change temperature of the phase change fluid, the plug may be moved to the open position, allowing the coolant to flow from the first fluid space to the second fluid space by the communication channel, thereby cooling the heat dissipation assembly. The movement of the plug between the open position and the close position occurs without any power consumption, thus achieving energy saving effect.

Although the invention has been disclosed through the aforementioned embodiments, it is not intended to limit the scope of the invention. Those skilled in the art may make various modifications and adjustments without departing from the spirit and scope of the invention. Therefore, the scope of patent protection for the invention shall be defined by the following claims of the specification.

What is claimed is:

1. A heat dissipation assembly, comprising:

a casing, having a first fluid space, a second fluid space, and a communication channel, the first fluid space and the second fluid space are in fluid communication with each other by the communication channel;

a pushed member, a first end of the pushed member being fixed to the casing;

a plug, movably disposed in the casing and having a closed position and an open position, the plug comprising an inner space, wherein a second end of the pushed member extends into the inner space; and a phase change fluid, disposed in the inner space, the second end of the pushed member seals the phase change fluid in the inner space;

wherein when the phase change fluid is in a liquid state, the plug is located at the closed position and closes the communication channel;

wherein when the phase change fluid vaporizes into a gaseous state and expands, the plug is pushed away from the first end, thereby moving the plug from the closed position to the open position.

2. The heat dissipation assembly according to claim 1, wherein the first fluid space is larger than the second fluid space.

3. The heat dissipation assembly according to claim 1, wherein a portion of the plug is located in the first fluid space.

4. The heat dissipation assembly according to claim 1, wherein the pushed member comprises a bar portion and a sealing portion in contact with each other, the bar portion is fixed to the casing, and the sealing portion is disposed in the inner space to separate the bar portion from the phase change fluid.

5. The heat dissipation assembly according to claim 4, wherein an end of the bar portion that is in contact with the sealing portion has a tapered shape.

6. The heat dissipation assembly according to claim 1, further comprising a heat dissipation substrate, wherein the casing is disposed on the heat dissipation substrate, the heat dissipation substrate has a third fluid space and a fourth fluid space, the third fluid space has a first inlet and a first outlet, and the fourth fluid space has a second inlet and a second outlet, the first fluid space is in fluid communication with the first outlet, and the second fluid space is in fluid communication with the second inlet.

7. The heat dissipation assembly according to claim 6, wherein the third fluid space is larger than the fourth fluid space.

8. The heat dissipation assembly according to claim 1, further comprising an elastic member, wherein the elastic member is disposed between the plug and the casing and pushes the plug to be kept in the closed position.

9. The heat dissipation assembly according to claim 1, wherein the casing comprises a main body, a cover, and a rubber gasket, the rubber gasket covers the main body, the rubber gasket is clamped between the cover and the main body, the pushed member is fixed to the cover and penetrates through the rubber gasket and the communication channel, the main body has the first fluid space, the second fluid space, and the communication channel, the first fluid space, the second fluid space, and the communication channel are partially defined by the rubber gasket.

* * * * *